US005783621A

United States Patent [19]

Iwamoto et al.

[11] Patent Number: 5,783,621
[45] Date of Patent: Jul. 21, 1998

[54] METHOD OF DECREASING BLEED FOM ORGANIC-BASED FORMULATIONS AND ANTI-BLEED COMPOSITIONS

[75] Inventors: Nancy E. Iwamoto, Ramona; Jesse L. Pedigo, La Mesa, both of Calif.

[73] Assignee: Johnson Matthey, Inc., Valley Forge, Pa.

[21] Appl. No.: 664,200

[22] Filed: Jun. 10, 1996

[51] Int. Cl.$^6$ ................................................ C08K 3/08
[52] U.S. Cl. ................................. 524/439; 524/440
[58] Field of Search ................................ 524/439, 440

[56] References Cited

U.S. PATENT DOCUMENTS

| | | | |
|---|---|---|---|
| 5,150,195 | 9/1992 | Nguyen | 357/72 |
| 5,155,066 | 10/1992 | Nguyen | 437/209 |
| 5,195,299 | 3/1993 | Nguyen | 53/428 |
| 5,250,600 | 10/1993 | Nguyen et al. | 524/377 |
| 5,371,178 | 12/1994 | Nguyen | 528/362 |
| 5,386,000 | 1/1995 | Nguyen | 528/362 |
| 5,399,907 | 3/1995 | Nguyen | 257/783 |

FOREIGN PATENT DOCUMENTS

WO8303210  9/1983  WIPO.

OTHER PUBLICATIONS

Michael R. Marks et al., "An Experimental Study of Die Attach Polymer Bleedout in Ceramic Packages", *Thin Solid Films*, 1994, pp. 54–60.

P.G. de Gennes, "The Dynamics of Wetting", pp. 173–179. "Describing the System", *Discover*, May 1994, pp. 2–1 to 2–5.

"Forcefields", *Discover*, May 1994, pp. 3–1 to 3–9.

Lieng–Haung Lee, "Roles of Molecular Interactions in Adhesion, Adsorption, contact Angle and Wettability", presented to the American Chemical Society Symposium on Adhesion, Contact Angle and Wettability, San Francisco, California, Apr. 1992, pp. 583–634.

J.E. Ireland, "Epoxy Bleedout in Ceramic Chip Carriers", Feb. 1982, *International J. Hybrid*, 4 pages.

M.L. White, "The Removal of Die Bond Epoxy Bleed Material by Oxygen Plasma", 32nd ECC Conti May 10–12, 1982, San Diego, California, pp. 262–265.

*Primary Examiner*—Edward J. Cain
*Attorney, Agent, or Firm*—Christie, Parker & Hale, LLP

[57] ABSTRACT

A method is described for determining high performing anti-bleed agents by comparing the structural characteristics of a compound to specified ranges of structurally-based variables. These structurally-based variables are determined by first comparing the structural characteristics of the best performing anti-bleed agents in a first set of computer simulations of anti-bleed agent candidates in a die attach adhesive on a substrate. The effects of other anti-bleed agent candidates are determined by plotting the structurally-based variables against modeled bleed. Predictive ranges are determined by the performance groups of the candidates with the coincidentally lowest bleed. Also disclosed are organic-based formulations suitable for assembling semiconductor devices including die attach adhesive useful for bonding a semiconductor device to a substrate that incorporates selected anti-bleed agents and which may additionally contain a filler.

68 Claims, 13 Drawing Sheets

FIGURE 13

METHOD OF DECREASING BLEED FOM ORGANIC-BASED FORMULATIONS AND ANTI-BLEED COMPOSITIONS

BACKGROUND

The present invention relates to reducing "bleed" from organic-based formulations and materials useful in semiconductor assemblies; more particularly, reducing resin bleed from organic-based materials such as die attach adhesives used to bond semiconductor devices to a substrate, including such materials as used in connection with PC boards, multi-chip modules, and in controlled collapse bump technology. The present invention encompasses compounds, and the selection of compounds, that reduce bleed when added to organic-based formulations and a method for determining such compounds.

Organic-based materials, such as die attach polymeric materials, have gained increasing popularity, in part for their ability to accommodate larger die sizes and to facilitate processing at lower temperatures. However, problems with bonded semiconductor devices resulting from "bleedout", also referred to as "bleed" or "resin bleed", or separation of the resin vehicle from the polymer adhesive, sometimes occur from the monomer as well as any other small molecule present. Such problems are discussed in detail in an article entitled "An Experimental Study of Die Attach Polymer Bleedout in Ceramic Packages" by Michael R. Marks, et al. which was published in Thin Solid Films, vol. 252, p. 54–60 in 1994. As indicated in the article, in severe bleedout conditions, the resin wets the entire substrate to which the die is to be attached and may succeed in "wicking up" the ceramic sidewalls and contaminate wire bonding metalization. This may result in weak wire bondings by virtue of acting as an interdiffusional barrier at the joints. Consequently, producers of the packages typically desire little or no bleed, or controlled bleed with tight tolerances.

The article by Marks, et al. suggests two methods to eliminate bleedout: surface energy reduction of the gold plating (on the substrate) or improvement in the cohesiveness of the polymer die attach material. The author suggests that bleedout may be eliminated by increasing the cohesiveness of the polymer matrix by increasing the intermolecular attractive energy through the presence of functional groups with high dipole moments in high concentrations. In particular, it is suggested that phenol-cured epoxy, polyamide and polycyanate were found to have good bleedout resistance which was attributed to high dipole moments of epoxide and hydroxyl in phenol-cured epoxy.

Die attach adhesive formulations which may be rapidly cured have been disclosed in Nguyen U.S. Pat. No. 5,150,195 issued Sep. 22, 1992 and Nguyen U.S. Pat. No. 5,155,066 issued Oct. 13, 1992, the disclosures of which are expressly incorporated herein by reference. Rapidly curable adhesive formulations such as disclosed in the aforementioned patents may contain a cyanate ester vehicle, curing catalysts such as alkylphenols, metal curing catalysts such as metal chelates, and fillers, which may be electrically and/or thermally conductive. Such cyanate ester-containing formulations are capable of being fully cured in less than five minutes at 200° C., and often in about two minutes, or less, at 200° C.

However, in addition to rapid curability, it is important for a die attach adhesive formulation to minimize bleed or "flash-off." These terms describe the excessive spreading of a resin on an attached substrate during curing, and in the case of a cyanate ester formulation, flashing-off of the monomer, which may result in the monomer being redeposited in the vicinity of the bonded area. The problems of bleed and flash-off are of special concern in continuous in-line fast-curing processes, i.e., continuous processes for the production of bonded semiconductor assemblies.

Theoretically, bleed is a predictable event using the spreading equation described by Marangoni in *Tipographia dei fatelli Fusi, Pavia* in 1865 and by W. F. Cooper and W. H. Nuttal in the *Journal of Agricultural Sciences* Vol. 7, p. 219 in 1915. Such equations predict that if the combined liquid and interfacial energies are higher than that of the substrate, spreading will not occur. However, in order to predict spreading, the surface energies of the liquid, the solid and the interface must be known.

As a practical matter, these quantities are difficult and time consuming to measure. Therefore, using energy effects as a predictive tool is burdensome, requiring extensive testing and calculation.

The present invention provides a method to reduce bleed or bleedout of the organic-based formulations used in semiconductor devices which is particularly applicable to cyanate ester-containing die attach adhesives, and to a novel formulation exhibiting reduced resin bleed as well as a method of selecting compounds that may be added to such polymeric materials to reduce bleed.

SUMMARY OF THE INVENTION

The invention is directed to reducing resin bleed from organic-based formulations used in the assembly of a semiconductor device. This includes reducing resin bleed from organic-based formulations used in PC boards, multi-chip modules, ceramic and plastic packages, laminate grid array (LGA) packages and tab automated bonding (TAB) structures, where the polymeric material utilized is applied as a die attach, an encapsulant, an underfill or a high conductive paste for polymer bumps as used in controlled collapse bump, or "flip chip," technology.

For instance, for ceramic packages (which include: the dual-in-line (DIP), leadless chip carrier (LLCC), quad flat pack (QFP) and pin grid arrays (PGA)), formulation contact will usually involve controlled bleed of the die attach on a gold deposited surface or a bare ceramic surface as well as the die. For plastic packages (which include: DIP families, LLCC, small outline families (SOP), plastic leaded chip carriers (PLCC), PGA and the quad flat pack (QFP) family), formulations which include the die attach as well as the encapsulant must exhibit controlled bleed properties on the die and the metallized lead frame surface (copper, silver, gold). Controlled bleed will also become a concern for laminate packages consisting of a reinforced polymer material. Laminates are involved in plastic packages as well as a direct configurational competition to ceramic packages in the form of laminate land grid arrays (LGA) packages manufactured by Johnson Matthey Electronics—Semiconductor Processing Group. In the LGA package, the die attach must exhibit controlled wetting in contact with the die, a solder mask material, and a heat slug material consisting of a nickel or copper surface. In this package other adhesives must also exhibit controlled wetting. An example is the heat slug adhesive used to attach the heat slug to the laminate. Controlled wetting on tab automated bonding (TAB) structures are similar to the plastics area in that the formulation in the form of an encapsulant or die attach must be compatible with the substrate surface (copper, silver, gold), as well as a solder mask and die. The technique used to control resin bleed has been found to be particularly useful with cyanate ester formulations that contain polymeric, monomeric, and small moleculesized entities.

In one embodiment, a die attach adhesive suitable for bonding a semiconductor device to a substrate with reduced bleed, or tendency to bleed, is made by incorporating an anti-bleed agent in the adhesive and may also contain up to about 90 wt. % of at least one electrically or thermally conductive filler. Although other proportions may be used, a preferred formulation for a die attach adhesive may contain, in addition to an anti-bleed agent, up to about 10 wt. % organic composition, e.g., a resin mixture such as a cyanate ester-containing material, and up to about 90 wt. % filler.

Preferred die attach adhesives comprise a resin mixture, advantageously a cyanate ester-containing resin mixture, up to about 90 wt. % filler, and an anti-bleed agent determined and selected in accordance with this invention.

Useful fillers include silver, gold, aluminum, copper and palladium, and alloys and compounds thereof, as well as silica, alumina, aluminum nitride and silicon carbide.

According to the present invention, an anti-bleed agent candidate is determined by comparing its structural characteristics to a number of ranges of structural variables. These structural variables are calculated from modeled geometric relationships and ratios derived from the molecule's two-dimensional structure. Satisfactory candidates are selected for use as anti-bleed agents in die attach adhesives. These structural variables include:

(a) a monomer end-to-end distance of less than 12.2 angstroms or greater than 12.6 angstroms; (b) a ratio of formula weight to number of heavy atom bonds of 13 to 16 grams; (c) a ratio of formula weight to end-to-end distance of 18 to 22 grams/angstrom; (d) a ratio of heavy atoms to heavy atom bonds of 1 to 1.1; (e) a ratio of weight fraction of carbon to formula weight of 0.7 to 0.95; (f) a ratio of formula weight to number of carbon to carbon bonds of 14 to 20 grams; and (g) a heteroatom content of 1 to 2 defined herein as either oxygen, nitrogen or silicon. In the preferred embodiment, high performing anti-bleed candidates are chosen from those compounds with structural characteristics which fall within at least five of these predictive ranges.

Predictive ranges for all structural variables are determined by modeling the effects of a number of anti-bleed agent candidates for possible use in a die attach adhesive for bonding semiconductor devices on a substrate using molecular modeling techniques. Structurally-based variables are derived from the highest performing anti-bleed agents in the simulations. In subsequent sets of simulations, the structurally-based variables of each anti-bleed agent candidate is plotted against the modeled bleed in the die attach adhesive. Performance groups consisting of the anti-bleed agent candidates producing the lowest amount of bleed in the die attach adhesive are used to determine predictive ranges of anti-bleed performance.

The structural characteristics of a high performing anti-bleed agent may then be profiled from these predictive ranges of the structurally-based variables utilized. An indication of an anti-bleed agent candidate's performance is obtained by combining the modeled bleed of the candidate and its structural profile into one performance rating or risk.

DETAILED DESCRIPTION

Referring to the drawings, FIGS. 1 to 7 illustrate a set of structural variables and ranges which can be used to predict high performing anti-bleed agent candidates according to one embodiment of the invention. In order to determine structural characteristics indicative of a high performing anti-bleed agent, several computer simulations of a die attach adhesive, in this case, a cyanate ester monomer binder with a silver flake filler on a sample substrate, e.g., gold, were performed using commercially available molecular modeling software, such as the Discover program by Biosym/MSI.

It has been found that there is an interaction of the filler and the modifier. Generally, adjustment of the silver filler level and the anti-bleed agent level together will control bleed as well as control the viscosity. The range of silver filler levels may be about 60 to 90 wt. % without compromising the viscosity or workability of the formulation. Controlled bleed has been achieved without inorganic clay fillers, but it is preferred that adequate silver surface area control also compensate for the lack of inorganic filler. It is believed that bleed control occurs by balancing the attractions of the binder to silver interfaces with that of the attractions of the binder to substrate interfaces. Ideally, just enough binder is used to fill voids and serve as viscosity/ dispense control, but enough of the right binder type (e.g. anti-bleed agent plus cyanate ester) so that the binder stays between the potentials defined by the silver and substrate surfaces when remaining for long periods of time.

Molecular modeling according to the present invention consists of energy minimizing the molecules of the antibleed agent candidate and binder molecules on the filler. Energy minimization basically consists of a spatial search for the lowest energy configurations and relative geometries of the molecules. Bonds and angles with in the molecules also change to find this minimum. The Discover program and other force-field based simulations approximate the potential energy for a given configuration of atoms. The calculation of this energy provides the information necessary for subsequent energy minimization and dynamics simulations.

Once the paste has been minimized on the substrate, the bleed is simulated using a dynamics calculation, which simulates how the paste responds to temperature in the presence of the substrate. It has been found that running a dynamics simulation of 5,000 steps at a temperature of 300K provides an acceptable model.

In each simulation, the modeled die attach adhesive incorporates a different anti-bleed agent candidate in the binder and the amount of simulated bleed in the die attach adhesive is determined. For purposes of the computer modeling, bleed is defined as any lateral movement of the binder molecules at the substrate surface outside of the boundaries set by the filler particles. The rationale behind this definition is that if adhesion to the silver flake and the cohesion of the binder is high enough, the molecules of the binder will not migrate substantially outside of the boundary defined by the silver layer's radius of influence. The highest performing anti-bleed agents can be predicted directly from the amount of bleed in the model.

It should be noted that because bleed occurs before the monomer has time to polymerize, the computer analysis concentrates on the monomeric form of the binder in this instance.

Using the highest performing anti-bleed agents determined from this first set of simulations, structurally-based variables common to the high performers are derived. The anti-bleed agents are compared for structural similarities based upon size (mass and length), bond type and atom type. Other aspects such as simulated effects on the geometries of the surrounding cyanate ester monomer are also considered. The anti-bleed agents are then separated by performance using these geometrical and mass variables.

The results of the simulations are then compiled and plotted. From this data, the structural variables and their respective desired ranges are determined.

In the embodiment described, seven structural variables are used. FIGS. 1 to 7 illustrate the relationship between several structural variables of anti-bleed agent candidates on the modeled bleed in the die attach adhesive.

Figure 1:
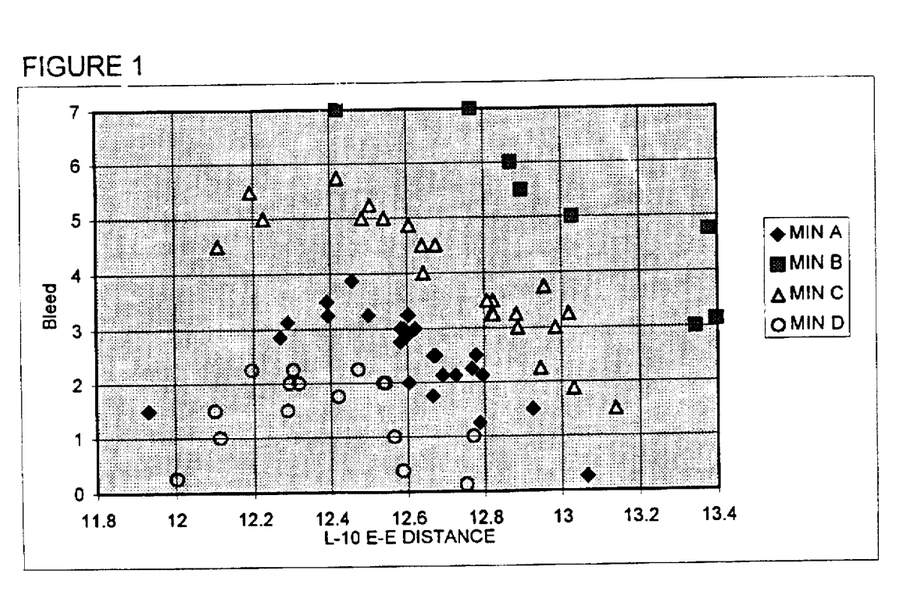
FIG. 1 is a graph of the modeled bleed of a die attach adhesive vs. the monomer end-to-end distance of a group of anti-bleed agents.

FIG. 1 plots modeled bleed vs. monomer (in this case the monomer is AROCY L-10 cyanate ester from Ciba Giegey) end-to-end distance ("E—E Distance"), with an optimal range of <12.2 angstroms or >12.6 angstroms. This figure demonstrates that low bleed occurs within each performance group at each end of the distance range.

Figure 2:
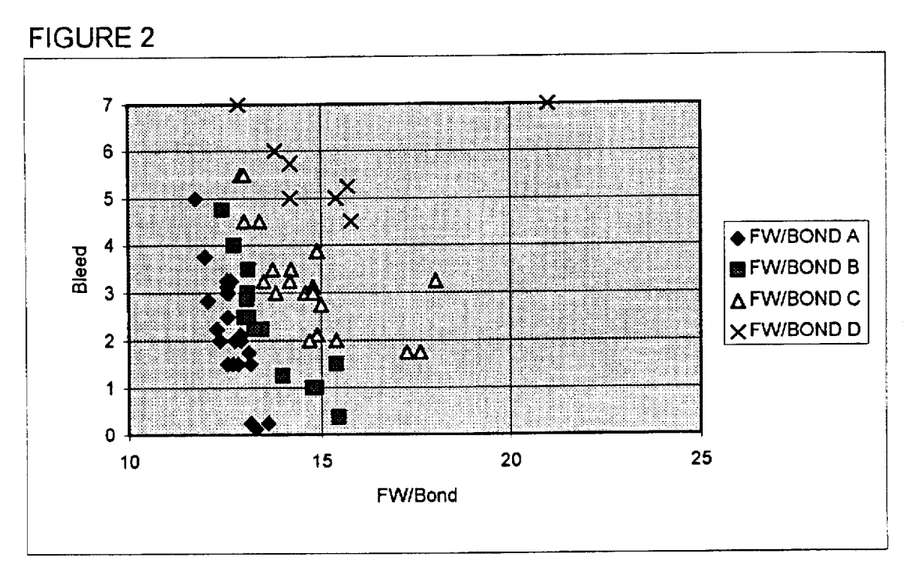
FIG. 2 is a graph of the modeled bleed of a die attach adhesive vs. the formula weight per number of heavy atom bonds of a group of anti-bleed agents.

FIG. 2 plots modeled bleed vs. formula weight (FW) per number of heavy atom bonds with a range of 13–16 grams being optimal. This figure shows the effect of the FW/bond (formulate weight/bond) variable on modeled bleed separated into performance groups. For lowest bleed, the FW/bond extends over two performance groups in the 13–16 gram range. This variable may also be considered a mass per bond effect, describing how the average bond must respond to a mass-action or force. This correlation also suggests that low bleed will not be obtained with too high of a mass range which is characteristic of molecules with a large chain length or a large number of heteroatoms.

Figure 3:
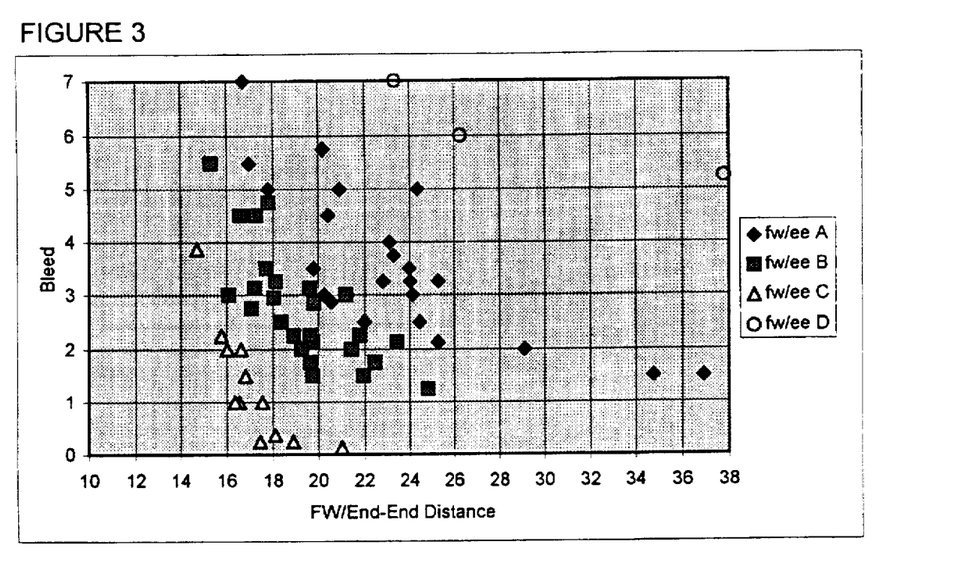
FIG. 3 is a graph of the modeled bleed of a die attach adhesive vs. the formula weight per end-to-end distance of a group of anti-bleed agents.

FIG. 3 plots modeled bleed vs. FW per end-to-end distance with an optimal range of 18–22 grams/angstrom. This figure again shows performance group separations based on FW/distance formula weight/end-to-end distance) and the modeled bleed. This figure gives an indication of effects of mass between the length of the modifier and can also be viewed as a one-dimensional density.

Figure 4:
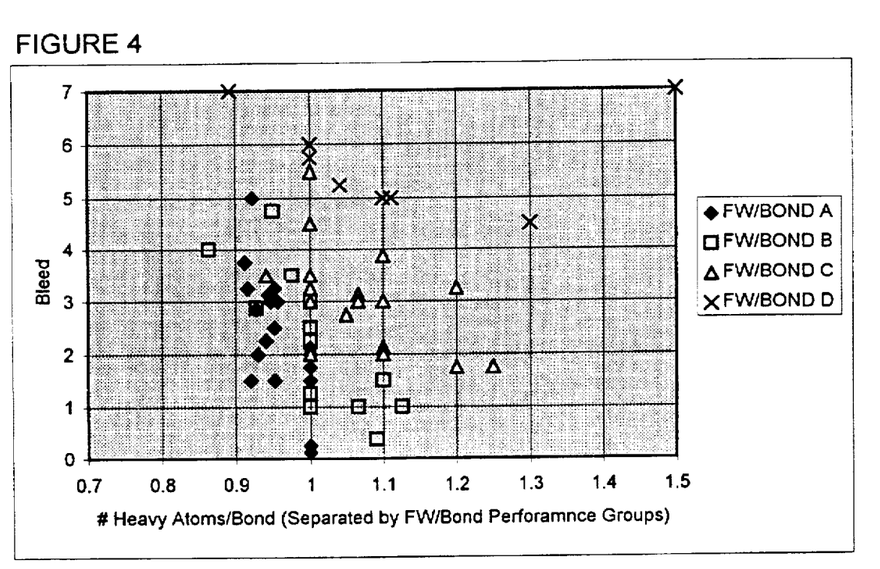
FIG. 4 is a graph of the modeled bleed of a die attach adhesive vs. the number of heavy atoms per heavy atom bonds of a group of anti-bleed agents.

FIG. 4 plots modeled bleed vs. the number of heavy atoms per heavy atom bonds with an optimal range of 1–1.1. This figure uses the same performance groupings as FIG. 2 to obtain an indication of the impact of cyclic structural content or chain length. An approximate value of 1–1.1 suggests that some cyclic content, and/or long chain length, will be helpful for low bleed tendencies.

Figure 5:
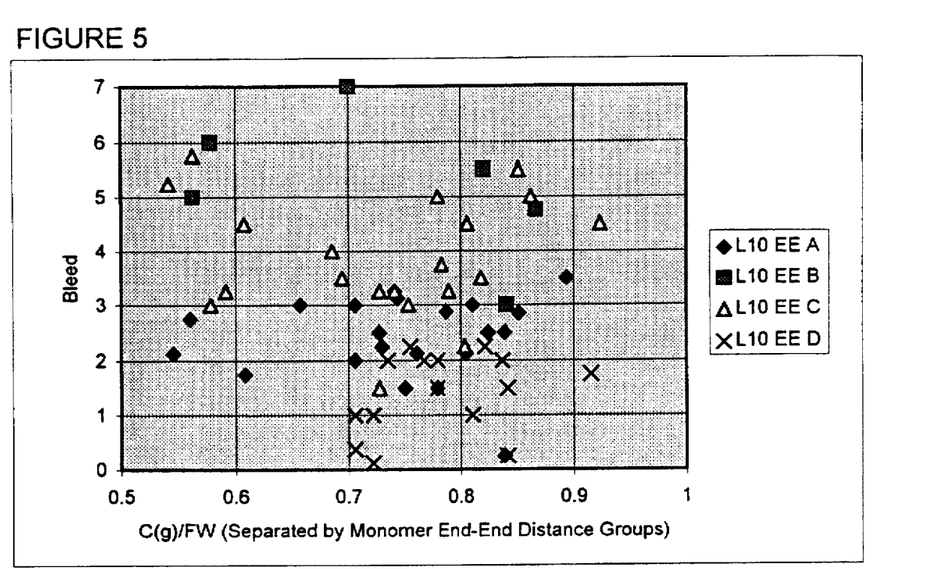
FIG. 5 is a graph of the modeled bleed of a die attach adhesive vs. the weight fraction of carbon to the formula weight of a group of anti-bleed agents.

FIG. 5 plots modeled bleed vs. the weight fraction of carbon (grams) to the formula weight with an optimal range of 0.7–0.95. This variable gives an indication of the amount of carbon needed in the overall structure. This indicates that the upper limit is probably under 1.0, suggesting that an all carbon structure is undesirable.

Figure 6:
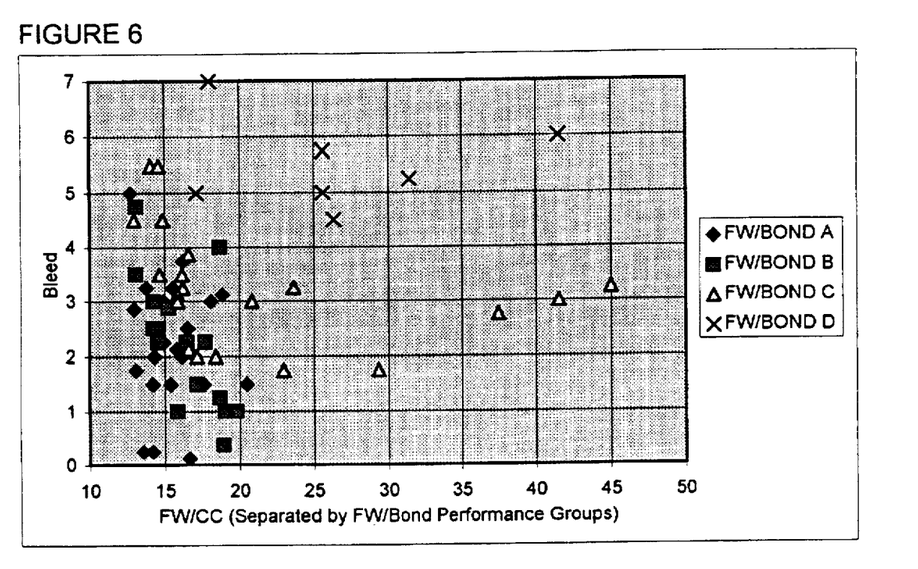
FIG. 6 is a graph of the modeled bleed of a die attach adhesive vs. the formula weight per number of carbon-to-carbon bonds of a group of anti-bleed agents.

FIG. 6 plots modeled bleed vs. FW per number of carbon-to-carbon bonds with an optimal range of 14–20 grams. This variable is based on the performance groups found in FIG. 2 and gives an indication of the impact of mass on the carbon-carbon linkages found in the structure.

Figure 7:
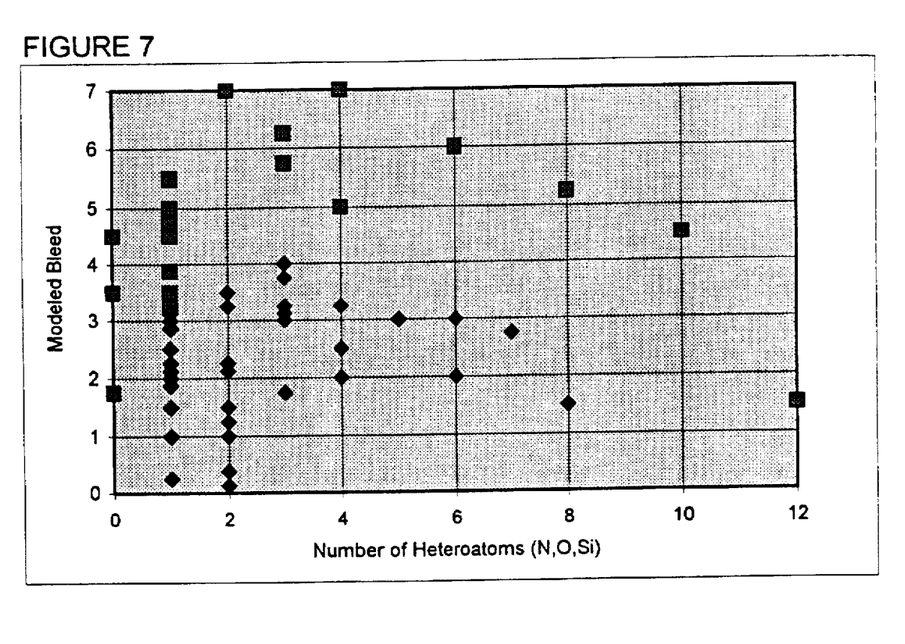
FIG. 7 is a graph of the modeled bleed of a die attach adhesive vs. the number of heteroatoms (oxygen, nitrogen or silicon) found in the structure.

FIG. 7 plots modeled bleed vs. the number of heteroatoms in the structure with an optimal range of 1–2. This figure indicates that a low number of heteroatoms are required for low bleed. As used herein heteroatom type is defined as either oxygen, nitrogen or silicon.

The ranges where compounds should hypothetically produce low bleed can be determined from FIGS. 1 to 7 by identifying the performance groups, i.e., either groups of those compounds producing the lowest amount of bleed in the die attach adhesive, or groups with similar performance trends. Within the latter are derived ranged from those groups that achieve the lowest bleed. This allows a profile of what the chemical compound for a potential anti-bleed agent should look like in order to have a high probability of significantly reducing bleed.

Figure 8:
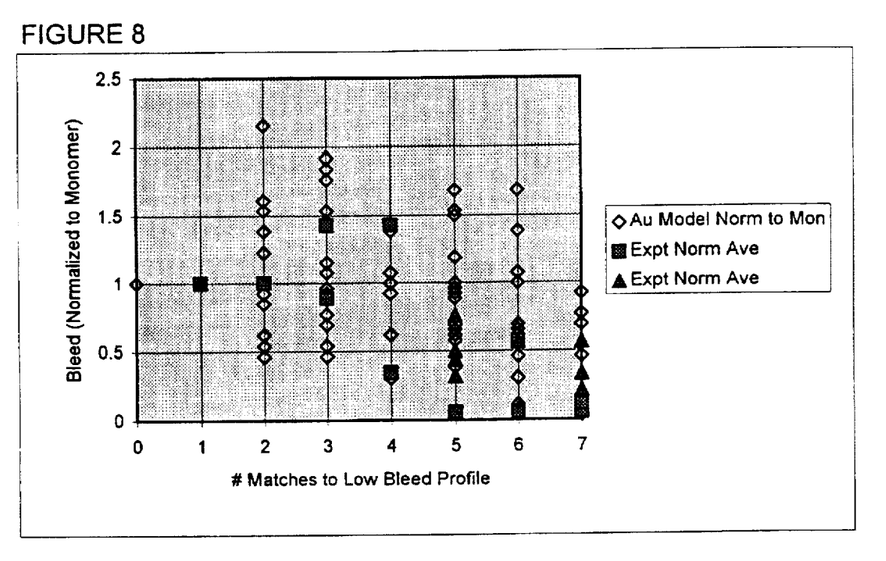
FIG. 8 is a graph of modeled bleed and experimental bleed of a die attach adhesive vs. the number of structural characteristics of a group of compounds tested for anti-bleed ability within a silver-filed cyanate ester die attach formulation on a gold substrate which fall within the predictive ranges for a high performing anti-bleed agents.
Figure 9:
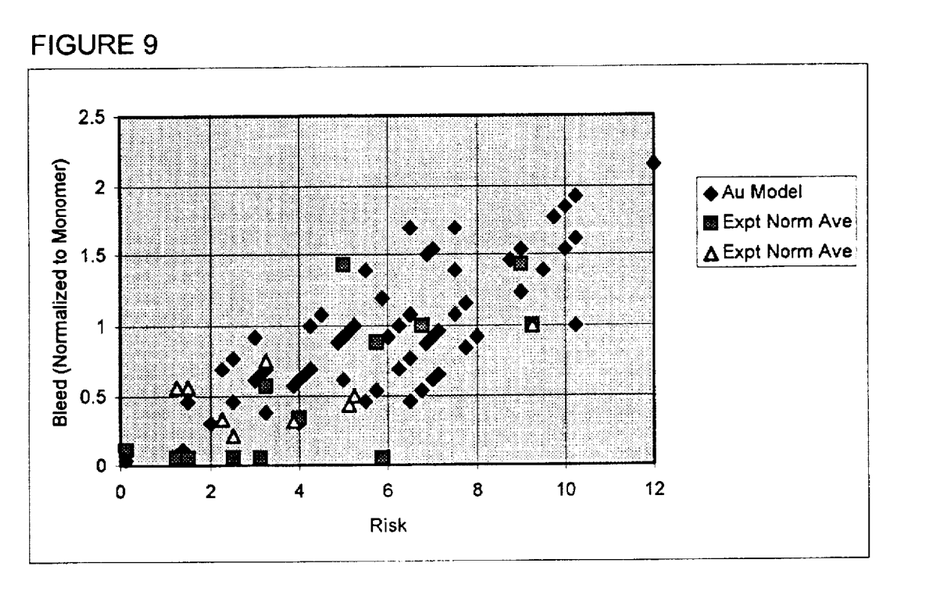
FIG. 9 is a graph of experimental bleed vs. the calculated risk derived from the modeled bleed and the number of deficiencies to the low bleed profile for a silver-filled cyanate ester formulation on a gold substrate.

As shown in FIG. 8, which plots bleed normalized to monomer results vs. number of matches to low bleed profile, experimental results have verified that the lowest bleed occurs when the anti-bleed agent candidates have the greatest number of matches to the ranges predicted in FIGS. 1 to 7 for overall low bleed. This contrasts model (Au substrate) results and experimental (Expt) results. Also, FIG. 9 demonstrates the low experimental bleed corresponding to a low risk factor where the risk of significant bleed is calculated from the modeled bleed and the number of deficiencies to the low bleed profile.

Figure 13:
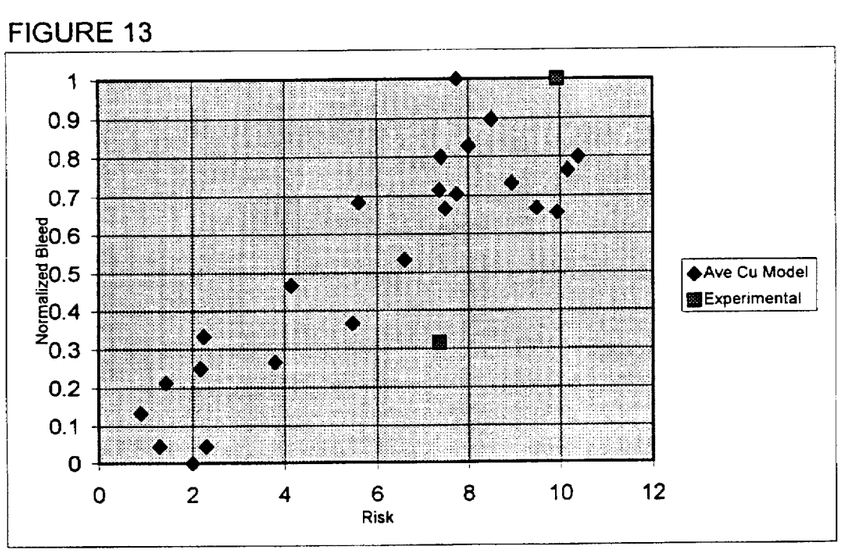
FIG. 13 is a graph of the normalized bleed on copper vs. the average risk, comparing a group of compounds modeled for anti-bleed character to two experimental formulations - one with and one without an anti-bleed agent. The highest experimental bleed example shows the formulation performance without an anti-bleed agent.

These risk factors are also useful in predicting the bleed performance of formulations which are too complicated to model explicitly or where an extrapolation is required from elements of previous models. Although the experimental formulations cannot be modeled explicitly due to unknown and proprietary components, the effect of the anti-bleed agent may be estimated using averaged results of known modeled components. The bleed performance can be predicted for such formulations from an average risk factor which is derived from the particular compounds incorporated in the formulation. FIG. 13 uses an average risk to estimate the relative performance risk of the two formulations tested.

Benzylidene malonitrile, cis- and trans-dimethyloctadienitrile, and cis- and trans-citronitrile have experimentally performed well as anti-bleed agents. These compounds have low modeled bleed and 6, 7, 5, 7 and 6 matches, respectively, to the variable ranges predicted for low bleed. In addition, mandelonitrile, furylmethacrylate, methylbenzylcyanide, alpha-methyl-trans-cinnamaldehyde and phenylpropanedione also show low modeled bleed and have demonstrated reduced bleed performance.

Figure 10:
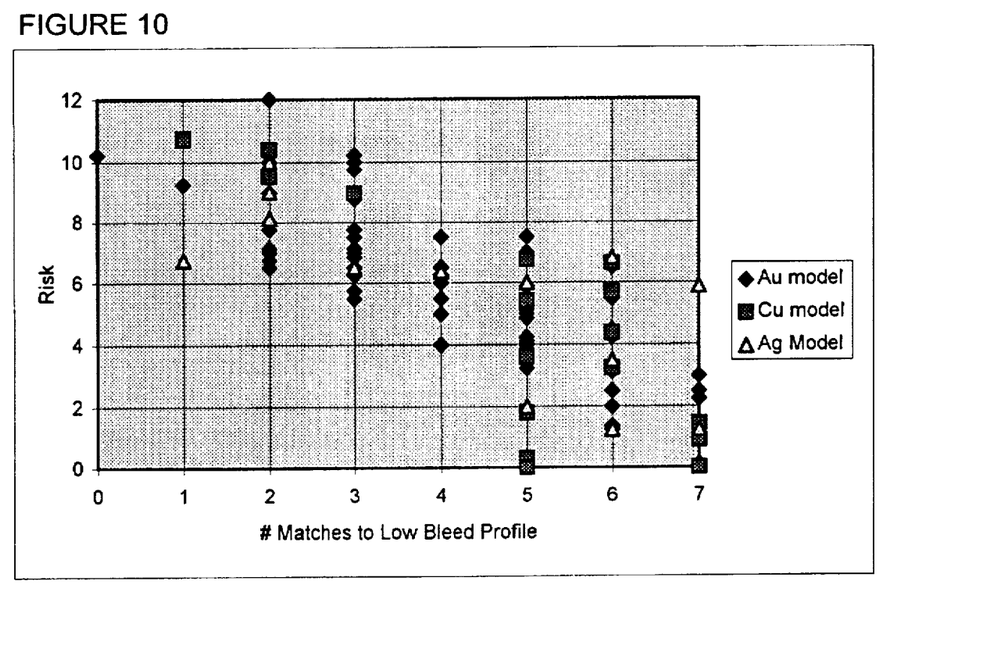
FIG. 10 is a graph of risk vs. the number of structural characteristics of a group of compounds in formulation, modeled for anti-bleed character for three different metal substrates (gold, copper and silver), which shows similar predictive qualities even on these different surfaces.
Figure 11:
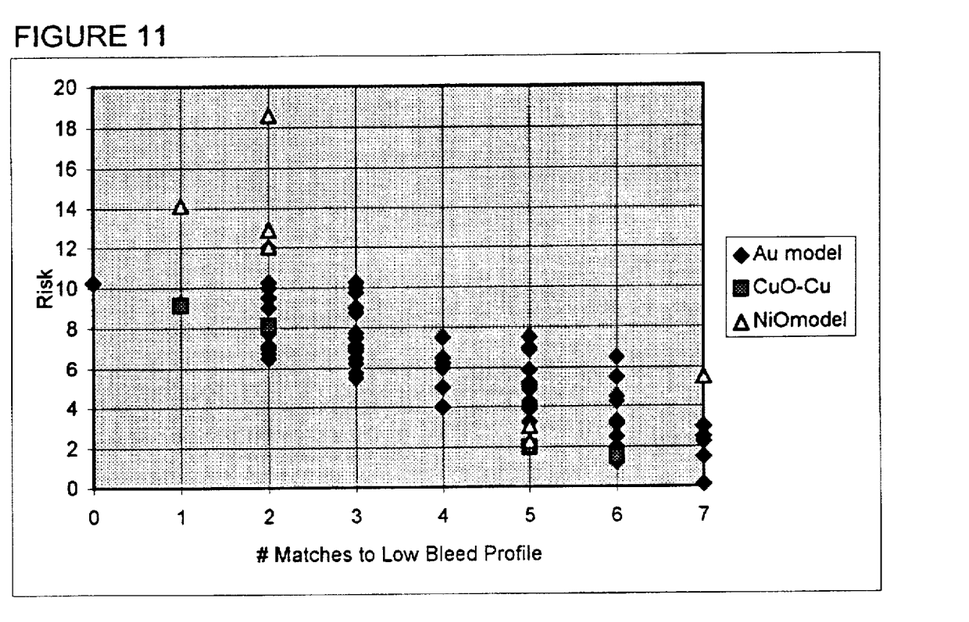
FIG. 11 is a graph of risk vs. the number of structural characteristics of a group of compounds modeled for anti-bleed character for a gold substrate compared with selected models for copper oxide and nickel oxide substrates, indicating a trend of anti-bleed agents with a high variable match to the low bleed profile obtaining a low risk for bleed on all substrates.

It is also to be understood that besides chip attachment using die attach materials, in the ball grid array family (BGA) and flip chip areas the formulation in the form of an encapsulant and underfill, must be compatible or exhibit controlled wetting on the substrate (such as bare laminate, gold, copper or silver), the solder mask, the solder balls and the die. FIGS. 10 and 11 demonstrate similar predictive analysis using copper, silver, copper oxide and nickel oxide as substrates. Flip chip and BGA attachment will be found in the plastics as well as the TAB packages. For polymer-based bumps for flip chip, the uncured bump binder must exhibit controlled bleed with the die and a possible mask material.

There are many solder mask materials which require adjustment of the binder formulations for compatibility, however, most are based upon either epoxy, acrylate, urethane or olefinic type formulations. Generally, spreading theory suggests that the problems with a polymer surface may not be as bad as a metal or inorganic surface since non-organic surface energies are generally high. This will also be true of the laminate substrates (usually made of materials such as BT resin, FR-4, PEEK, PBZT, BCB and other general epoxies, phthalalates and imides). However, specific control of the affinity for the cyanate ester formulation for the cured polymer material will also depend upon the type of functionalities dominating the surface energy of the mask material. This may indicate that bleed may be under control, but adhesion is not.

Figure 12:
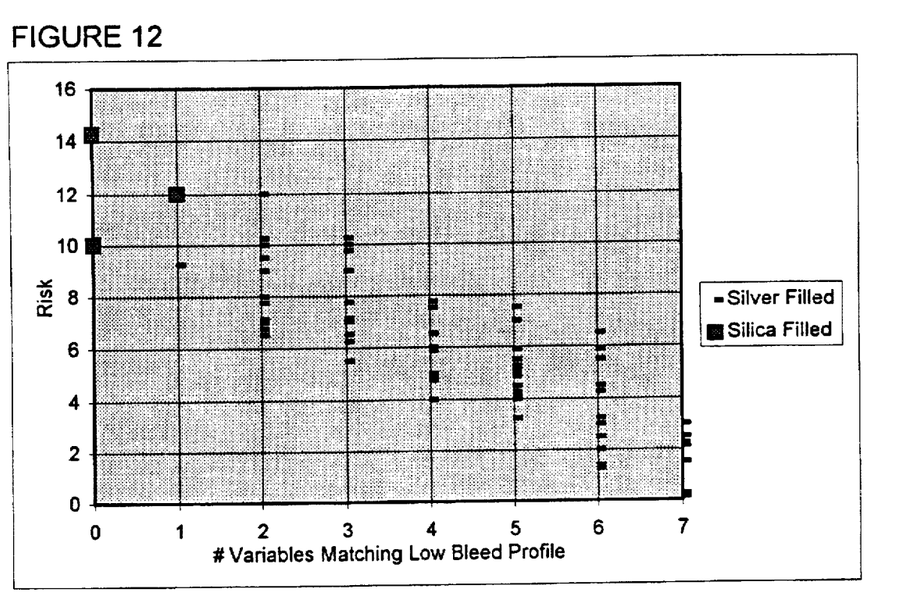
FIG. 12 is a graph of risk vs. the number of structural characteristics of a group of compounds modeled for anti-bleed character on a gold substrate using silver-fill compared to a silica-filler in three comparison formulations.

Those skilled in the art will recognize modifications and substitutions to the elements of the embodiments described herein that may be made without departing from the invention. For example, other organic-based formulations may be modeled on different substrates and contact surfaces common to semiconductor packages. As an example, FIGS. 10–12 show the predictive analysis results of various anti-bleed agents in formulation on gold, copper, silver, copper oxide, and nickel oxide substrates, and on gold with a silica filler, respectively. Also, citronitrile has been shown experimentally to reduce bleed on both gold and copper substrates in formulations of varying complexity. An example of a copper substrate is found in FIG. 13, where the highest experimental bleed belongs to a formulation without an anti-bleed agent. Additionally, other structural variables may be found to be predictive. It may also be preferable to model a combination of several anti-bleed agents in the subject polymeric material. Such modifications and substitutions are within the scope of the present invention as defined in the following claims.

What is claimed is:

1. A method for decreasing bleed from an organic-based formulation used in the assembly of a semiconductor device comprising incorporating in the organic-based formulation at least one compound capable of decreasing bleed from the organic-based formulation, said compound having at least five of the following characteristics:

(a) an end-to-end distance of less than 12.2 angstroms or greater than 12.6 angstroms;

(b) a ratio of formula weight to number of heavy atom bonds of 13 to 16 grams/bond;

(c) a ratio of formula weight to end-to-end distance of 18 to 22 grams/angstrom;

(d) a ratio of heavy atoms to heavy atom bonds of 1 to 1.1 atoms/bond;

(e) a ratio of weight fraction of carbon to formula weight of 0.7 to 0.95;

(f) a ratio of formula weight to number of carbon to carbon bonds of 14 to 20 grams/bond; or (g) 1 to 2 heteroatoms.

2. The method of claim 1 wherein the compound possesses at least six of the characteristics.

3. The method of claim 1 wherein the compound possesses at least seven of the characteristics.

4. The method of claim 1 wherein the organic-based formulation comprises a die attach adhesive and the die attach adhesive comprises an electrically conductive filler and cyanate ester-containing material.

5. The method of claim 4 wherein the filler comprises silver.

6. The method of claim 2 wherein the compound comprises benzylidene malonitrile and the organic-based formulation comprises a cyanate-ester formulation.

7. The method of claim 3 wherein the compound comprises cis-dimethyloctadienitrile and the organic-based formulation comprises a cyanate-ester formulation.

8. The method of claim 1 wherein the compound comprises trans-dimethyloctadienitrile and the organic-based formulation comprises a cyanate-ester formulation.

9. The method of claim 3 wherein the compound comprises cis-citronitrile and the organic-based formulation comprises a cyanate-ester formulation.

10. The method of claim 2 wherein the compound comprises trans-citronitrile and the organic-based formulation comprises a cyanate-ester formulation.

11. The method of claim 2 wherein the compound comprises mandelonitrile and the organic-based formulation comprises a cyanate-ester formulation.

12. The method of claim 1 wherein the compound comprises furylmethacrylate and the organic-based formulation comprises a cyanate formulation.

13. The method of claim 3 wherein the compound comprises methylbenzylcyanide and the organic-based formulation comprises a cyanate formulation.

14. The method of claim 1 wherein the compound comprises alpha-methyl-trans-cinnamaldehyde and the organic-based formulation comprises a cyanate formulation.

15. The method of claim 3 wherein the compound comprises phenylpropanedione and the organic-based formulation comprises a cyanate formulation.

16. The method of claim 2 wherein the compound comprises benzylidene malonitrile.

17. The method of claim 3 wherein the compound comprises cis-dimethyloctadienitrile.

18. The method of claim 1 wherein the compound comprises trans-dimethyloctadienitrile.

19. The method of claim 3 wherein the compound comprises cis-citronitrile.

20. The method of claim 2 wherein the compound comprises trans-citronitrile.

21. The method of claim 2 wherein the compound comprises mandelonitrile.

22. The method of claim 1 wherein the compound comprises furylmethacrylate.

23. The method of claim 3 wherein the compound comprises methylbenzylcyanide.

24. The method of claim 1 wherein the compound comprises alpha-methyl-trans-cinnamaldehyde.

25. The method of claim 3 wherein the compound comprises phenylpropanedione.

26. An anti-bleed agent adapted to be incorporated in a die attach adhesive containing an organic-based formulation, said anti-bleed agent comprising at least one compound capable of decreasing bleed from the organic-based formulation, said compound having at least five of the following characteristics:

(a) an end-to-end distance of less than 12.2 angstroms or greater than 12.6 angstroms;

(b) a ratio of formula weight to number of heavy atom bonds of 13 to 16 grams/bond;

(c) a ratio of formula weight to end-to-end distance of 18 to 22 grams/angstrom;

(d) a ratio of heavy atoms to heavy atom bonds of 1 to 1.1 atoms/bond;

(e) a ratio of weight fraction of carbon to formula weight of 0.7 to 0.95;

(f) a ratio of formula weight to number of carbon to carbon bonds of 14 to 20 grams/bond; or (g) 1 to 2 heteroatoms.

27. The anti-bleed agent of claim 26 wherein the compound possesses six of the characteristics.

28. The anti-bleed agent of claim 26 wherein the compound possesses seven of the characteristics.

29. A die attach adhesive incorporating an anti-bleed agent according to claim 28 wherein and further comprising an electrically or thermally conductive filler and a cyanate ester-containing material.

30. The die attach adhesive of claim 29 wherein the filler comprises silver.

31. An anti-bleed agent according to claim 26 comprising benzylidene malonitrile and the die attach adhesive comprising a cyanate-ester formulation.

32. An anti-bleed agent according to claim 28 comprising cis-dimethyloctadienitrile and the die attach adhesive comprising a cyanate-ester formulation.

33. An anti-bleed agent according to claim 26 comprising trans-dimethyloctadienitrile and the die attach adhesive comprising a cyanate-ester formulation.

34. An anti-bleed agent according to claim 28 comprising cis-citronitrile and the die attach adhesive comprising a cyanate-ester formulation.

35. An anti-bleed agent according to claim 27 comprising trans-citronitrile and the die attach adhesive comprising a cyanate-ester formulation.

36. An anti-bleed agent according to claim 26 comprising mandelonitrile and the die attach adhesive comprising a cyanate-ester formulation.

37. An anti-bleed agent according to claim 26 comprising furylmethacrylate and the die attach adhesive comprising a cyanate ester formulation.

38. An anti-bleed agent according to claim 28 comprising methylbenzylcyanide and the die attach adhesive comprising a cyanate ester formulation.

39. An anti-bleed agent according to claim 26 comprising alpha-methyl-trans-cinnamaldehyde and the die attach adhesive comprising a cyanate ester formulation.

40. An anti-bleed agent according to claim 28 comprising phenylpropanedione and the die attach adhesive comprising a cyanate ester formulation.

41. An anti-bleed agent according to claim 26 comprising benzylidene malonitrile.

42. An anti-bleed agent according to claim 28 comprising cis-dimethyloctadienitrile.

43. An anti-bleed agent according to claim 26 comprising trans-dimethyloctadienitrile.

44. An anti-bleed agent according to claim 28 comprising cis-citronitrile.

45. An anti-bleed agent according to claim 27 comprising trans-citronitrile.

46. An anti-bleed agent according to claim 26 comprising mandelonitrile.

47. An anti-bleed agent according to claim 26 comprising of furylmethacrylate.

48. An anti-bleed agent according to claim 28 comprising of methylbenzylcyanide.

49. An anti-bleed agent according to claim 26 comprising of alpha-methyl-trans-cinnamaldehyde.

50. An anti-bleed agent according to claim 26 comprising of phenylpropanedione.

51. An organic-based formulation comprising a curable organic material capable of use in the assembly of a semiconductor device and an anti-bleed agent, said anti-bleed agent comprising at least one compound capable of decreasing bleed in the organic-based formulation, said compound having at least five of the following characteristics:

(a) an end-to-end distance of less than 12.2 angstroms or greater than 12.6 angstroms;

(b) a ratio of formula weight to number of heavy atom bonds of 13 to 16 grams/bond;

(c) a ratio of formula weight to end-to-end distance of 18 to 22 grams/angstrom;

(d) a ratio of heavy atoms to heavy atom bonds of 1 to 1.1 atoms/bond;

(e) a ratio of weight fraction of carbon to formula weight of 0.7 to 0.95;

(f) a ratio of formula weight to number of carbon to carbon bonds of 14 to 20 grams/bond; or (g) 1 to 2 heteroatoms.

52. An organic-based formulation according to claim 44 wherein said organic material comprises a cyanate ester-containing die attach adhesive and said adhesive includes an electrically or thermally conductive filler.

53. An organic-based formulation according to claim 45 wherein said filler comprises silver.

54. The formulation of claim 51, wherein said compound has at least six of the characteristics.

55. The formulation of claim 51, wherein the compound has at least seven of the characteristics.

56. The formulation of claim 51, where in the compound comprises benzylidene malonitrile.

57. The formulation of claim 51, wherein the compound comprises cis-dimethyloctadienitrile.

58. The formulation of claim 51, wherein the compound comprises trans-dimethyloctadienitrile.

59. The formulation of claim 51 wherein the compound comprises cis-citronitrile.

60. The formulation of claim 51 wherein the compound comprises trans-citronitrile.

61. The formulation of claim 51 wherein the compound comprises mandelonitrile.

62. The formulation of claim 51 wherein the compound comprises furylmethacrylate.

63. The formulation of claim 51 wherein the compound comprises methylbenzylcyanide.

64. The formulation of claim 51 wherein the compound comprises methyl-trans-cinnamaldehyde.

65. The formulation of claim 51 wherein the compound comprises phenylpropanedione.

66. A method for decreasing bleed from an organic-based formulation used in the assembly of a semiconductor device comprising incorporating in the organic-based formulation at least one compound selected from the group consisting of benzylidene malonitrile, cis-dimethyloctadienitrile, trans-dimetlhyloctadienitrile, cis-citronitrile, trans-citronitrile, mandelonitrile, furylmethacrylate, methylbenzylcyanide, alpha-methyl-trans-cinnamaldehyde, and phenylpropanedione.

67. A method according to claim 66, wherein the organic-based formulation comprises a cyanate-ester formulation.

68. An anti-bleed agent adapted to be incorporated in a die attach adhesive comprising at least one compound selected from the group consisting of benzylidene malonitrile, cis-dimethyloctadienitrile, trans-dimethyloctadienitrile, cis-citronitrile, trans-citronitrile, mandelonitrile, furylmethacrylate, methylbenzylcyanide, alpha-methyl-trans-cinnamaldehyde, and phenylpropanedione.

* * * * *